(12) United States Patent
Kim et al.

(10) Patent No.: US 10,768,860 B2
(45) Date of Patent: Sep. 8, 2020

(54) DATA STORAGE DEVICE, OPERATING METHOD OF THE SAME, AND ELECTRONIC SYSTEM INCLUDING THE SAME

(71) Applicant: SAMSUNG ELECTRONICS CO., LTD., Suwon-si, Gyeonggi-Do (KR)

(72) Inventors: Duk-Soo Kim, Seoul (KR); Jong-Wook Jeong, Hwaseong-si (KR); Hyoung-Taek Lim, Seoul (KR); Min-Woo Gu, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/550,553

(22) Filed: Aug. 26, 2019

(65) Prior Publication Data

US 2019/0377518 A1 Dec. 12, 2019

Related U.S. Application Data

(63) Continuation of application No. 15/905,933, filed on Feb. 27, 2018, now Pat. No. 10,423,360.

(30) Foreign Application Priority Data

Feb. 28, 2017 (KR) .................. 10-2017-0026474

(51) Int. Cl.
| | |
|---|---|
| *G06F 3/06* | (2006.01) |
| *G11C 16/10* | (2006.01) |
| *G11C 11/56* | (2006.01) |
| *G11C 16/04* | (2006.01) |
| *G06F 12/02* | (2006.01) |
| *G06F 13/16* | (2006.01) |

(52) U.S. Cl.
CPC ............ *G06F 3/0659* (2013.01); *G06F 3/061* (2013.01); *G06F 3/0616* (2013.01); *G06F 3/0635* (2013.01); *G06F 3/0679* (2013.01); *G06F 3/0688* (2013.01); *G11C 11/5671* (2013.01); *G11C 16/0483* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 8,341,338 | B2 | 12/2012 | Lee et al. |
| 9,348,377 | B2 | 5/2016 | Dean et al. |
| 9,384,846 | B1 | 7/2016 | Shim et al. |
| 9,711,232 | B2 | 7/2017 | Choi et al. |
| 9,760,311 | B1 | 9/2017 | Amir et al. |

(Continued)

FOREIGN PATENT DOCUMENTS

KR 1020050088587 9/2005

*Primary Examiner* — Michael Alsip
(74) *Attorney, Agent, or Firm* — Volentine, Whitt & Francos, PLLC

(57) ABSTRACT

A data storage device, a method of operating the data storage device, and an electronic system including the data storage device are provided. The data storage device includes a controller mounted on a substrate, and a plurality of memory packages configured to be controlled by the controller and to transmit and receive data to and from the controller via M channels (where M is an integer of 1 to 16). When the data storage device is used, a phenomenon in which heat generation is concentrated locally may be mitigated.

20 Claims, 16 Drawing Sheets

(56) References Cited

U.S. PATENT DOCUMENTS

| | | |
|---|---|---|
| 9,811,267 B1 | 11/2017 | Yang et al. |
| 9,916,087 B2 | 3/2018 | Thangaraj et al. |
| 2014/0365714 A1 | 12/2014 | Sweere et al. |
| 2015/0331460 A1 | 11/2015 | Mataya et al. |
| 2016/0055901 A1 | 2/2016 | Shoemaker |
| 2016/0078907 A1 | 3/2016 | Woo et al. |
| 2016/0179406 A1 | 6/2016 | Gorobets et al. |
| 2016/0364175 A1 | 12/2016 | Yang et al. |

DATA STORAGE DEVICE, OPERATING METHOD OF THE SAME, AND ELECTRONIC SYSTEM INCLUDING THE SAME

CROSS-REFERENCE TO RELATED APPLICATION

This is a Continuation of U.S. application Ser. No. 15/905,933, filed Feb. 27, 2018, which claims the benefit of Korean Patent Application No. 10-2017-0026474, filed on Feb. 28, 2017, in the Korean Intellectual Property Office, the disclosure of which is incorporated herein in its entirety by reference.

FIELD

The inventive concept relates to a data storage device, a method of operating the data storage device, and an electronic system including the data storage device, and more particularly, to a data storage device for preventing a phenomenon in which heat generation is concentrated locally, a method of operating the data storage device, and an electronic system including the data storage device.

BACKGROUND

Data storage devices, such as solid state drives (SSDs), are increasingly in demand as the data storage devices have the ability to quickly input and output large amounts of data thereto and therefrom. An SSD includes a controller and many non-volatile memory packages, and thus, device damage and performance degradation may occur in the SSD due to heat generation. Therefore, much research has been conducted into a method of reducing the amount of heat generated in the SSD.

SUMMARY

The inventive concept provides a data storage device which may exhibit improved data storage performance and reduced damage to a semiconductor device, as a phenomenon in which heat generation is concentrated locally is mitigated.

The inventive concept also provides a method of operating a data storage device which may exhibit improved data storage performance and reduced damage to a semiconductor device, as a phenomenon in which heat generation is concentrated locally is mitigated.

The inventive concept also provides an electronic system including a data storage device which may exhibit improved data storage performance and reduced damage to a semiconductor device, as a phenomenon in which heat generation is concentrated locally is mitigated.

According to an aspect of the inventive concept, there is provided a data storage device including: a controller mounted on a substrate; and a plurality of memory packages each having at least one semiconductor die, the memory packages being configured to be controlled by the controller and to transmit and receive data to and from the controller via M channels (where M is a first integer of 1 to 16). Each of the M channels includes N ways (where N is a second integer of 2 to 128), and semiconductor dies belonging to one channel are each configured to transfer a write operation to another semiconductor die belonging to the one channel when a write operation transfer condition is satisfied.

According to another aspect of the inventive concept, there is provided a data storage device including: a controller mounted on a substrate; and a plurality of memory packages, wherein the plurality of memory packages are configured to transmit and receive data to and from the controller via M channels (where M is a first integer of 1 to 16), wherein each of the M channels includes N ways (where N is a second integer of 2 to 128) and P memory packages (where P is a third integer of 2 to 64), and the controller is configured such that the numbers of ways respectively corresponding to the P memory packages are equal to each other when a write operation of data is performed through one channel.

According to another aspect of the inventive concept, there is provided a method of operating a data storage device including a controller and a plurality of memory packages configured to be controlled by the controller and to transmit and receive data to and from the controller via M channels (where M is a first integer of 1 to 16), each of which includes N ways (where N is a second integer of 2 to 128), each of the memory packages having at least one semiconductor die. The method includes: performing a write operation on a semiconductor die included in one of a plurality of memory packages belonging to one channel; determining whether a package switching condition is satisfied; and performing a next write operation on another semiconductor die included in another memory package belonging to the one channel when it is determined that the package switching condition is satisfied.

According to another aspect of the inventive concept, there is provided an electronic system including: a host; and a data storage device configured to write data therein in response to a write command input from the host, wherein the data storage device includes a controller and a plurality of memory packages configured to be controlled by the controller and to transmit and receive data to and from the controller via M channels (where M is a first integer of 1 to 16), each of which includes N ways (where N is a second integer of 2 to 128), each of the memory packages having at least one semiconductor die, wherein semiconductor dies belonging to one channel are each configured to transfer a write operation to another semiconductor die in the one channel when a write operation transfer condition is satisfied, and are each configured such that transfer of the write operation between packages is performed on a semiconductor die of another memory package in the one channel when a package switching condition is satisfied.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Hereinafter, embodiments of the inventive concept will be described in detail with reference to the accompanying drawings. The circuit configuration and operation of a data storage device according embodiment of the inventive concept will be described as an example below, and the data storage device may be variously changed and modified without departing from the technical idea of the inventive concept. For example, among semiconductor memory devices, a solid state drive (SSD) employing a NAND flash memory as a main storage device will be described as the data storage device. However, this is merely an example to which the inventive concept is applied, and the data storage device and a data storage method thereof may be applied to various types of data storage devices as well as SSDs.

Figure 1:
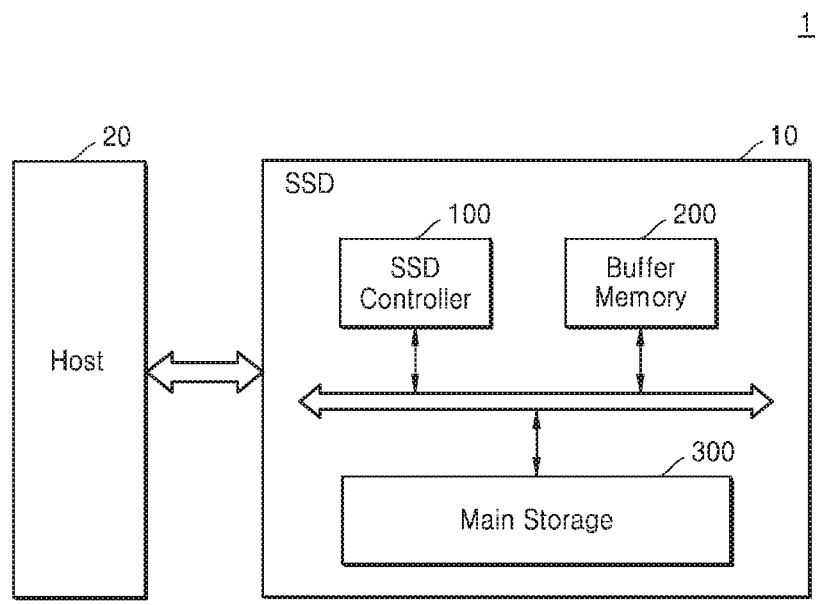
FIG. 1 is a block diagram conceptually illustrating the configuration of a memory system including a data storage device according to an embodiment of the inventive concept.

FIG. 1 is a block diagram conceptually illustrating the configuration of a memory system 1 including a data storage device 10 according to an embodiment of the inventive concept.

Referring to FIG. 1, memory system 1 may include data storage device 10, which is an SSD, and a host 20. Data storage device 10 may include a controller 100, a buffer memory 200, and a data storage unit 300.

Data storage unit 300 is main data storage of data storage device 10 and stores data by using semiconductor memory dies instead of a platter of a hard disk drive (HDD). Data storage unit 300 may include a non-volatile memory or a volatile memory, and a plurality of channels, for example, M channels CH0, CH1, . . . , CH(M−1) (see FIG. 2), may be provided between controller 100 and data storage unit 300. Each of the plurality of channels may be provided with a plurality of ways, for example, N ways. M may be a first integer from 1 to 16 and N may be a second integer from 2 to 128. However, the inventive concept is not limited thereto.

Here, a 'channel' is a unit for which a data write operation may be independently performed. Thus, a write operation for each channel may be performed in parallel (i.e., overlapping). A 'way' may be one or more memories that share a command channel and a data channel.

Hereinafter, data storage unit 300 will be described as including a non-volatile memory. However, it will be understood by those skilled in the art that a memory to be applied to data storage unit 300 may be configured in various forms without being limited to specific types and specific forms. For example, the memory applied to data storage unit 300 may include a non-volatile memory, such as a flash memory, a vertical NAND (VNAND) memory, a magnetoresistive random-access memory (MRAM), a phase-change RAM (PRAM) memory, or a resistive RAM (ReRAM) memory. In addition, the memory applied to data storage unit 300 may include a volatile memory such as DRAM. In some embodiments, data storage unit 300 may include a combination of at least one non-volatile memory and at least one volatile memory. In some embodiments, data storage unit 300 may include a combination of at least two types of non-volatile memories.

The number of data bits stored in each memory cell of the flash memories provided in data storage unit 300 may be variously configured. For example, the flash memories may include single-level flash memory cells, each of which stores one bit of data. In some embodiments, the flash memories may include multi-level flash memory cells, each of which stores a plurality of bits of data (e.g., two bits of data, four bits of date, etc.). In the case of a multi-level flash memory cell, a program time may vary depending on whether a least significant bit (LSB) or a most significant bit (MSB) is written. In addition, the program time may be variously configured according to a configuration manner of different flash memory cells, such as FN35, FN42, and FN51 which may have different channel widths.

Furthermore, the flash memories may be configured with various types of memory cells. For example, the flash memories may include at least one of a NAND flash memory, a NOR flash memory, and a One_NAND flash memory (e.g., a flash memory in which a flash memory core and a memory control logic are implemented as a single chip), or may be configured in a hybrid form in which at least two types of flash memories are combined. In addition, the structure of a charge storage layer in each of the memory cells of the flash memories may also be configured in various forms. For example, the charge storage layer of the memory cell may include conductive polycrystalline silicon or the like, or may include an insulating film such as a $Si_3N_4$, $Al_2O_3$, HfAlO, or HfSiO film. A flash memory having a structure using, as the charge storage layer, an insulating film such as a $Si_3N_4$, $Al_2O_3$, HfAlO, or HfSiO film may be referred to as a charge trap flash (CTF) memory.

Buffer memory 200 may temporarily store data transmitted and received between controller 100 and data storage unit 300 and data transmitted and received between controller 100 and host 20. In controller 100, a buffer memory control function for controlling a data input/output operation of buffer memory 200 may be provided. This may mean that the data input/output operation of buffer memory 200 may be performed through controller 100. Buffer memory 200 may be provided outside controller 100, as shown in FIG. 1, or may be provided inside controller 100 in another embodiment. Buffer memory 200 may be random access memory (RAM) such as DRAM or SRAM.

Controller 100 may control an operation of writing data to data storage unit 300 or reading data from data storage unit 300 in response to a command input from host 20. Controller 100 controls all operations of the SSD and is also referred to as an SSD controller. Controller 100 may include one or more central processing units (CPUs) or cores for controlling the operation of controller 100.

Controller 100 may perform a function of queuing a plurality of commands to be executed by data storage unit 300 and a function of controlling operation periods (particularly, a read period of a read command and a data transmission period) of queued commands. Native command queuing (NCQ), tagged command queuing (TCQ), or the like may be used for queuing a plurality of commands to be performed.

As will be described in more detail below, controller 100 may control a write operation to be physically and/or temporally substantially evenly distributed between memory packages corresponding to each channel. As a result, heat generated from each memory package may be more evenly distributed without being locally concentrated. Accordingly, the operation of the SSD may be smoothly performed without deteriorating the overall performance of the SSD.

Figure 2:
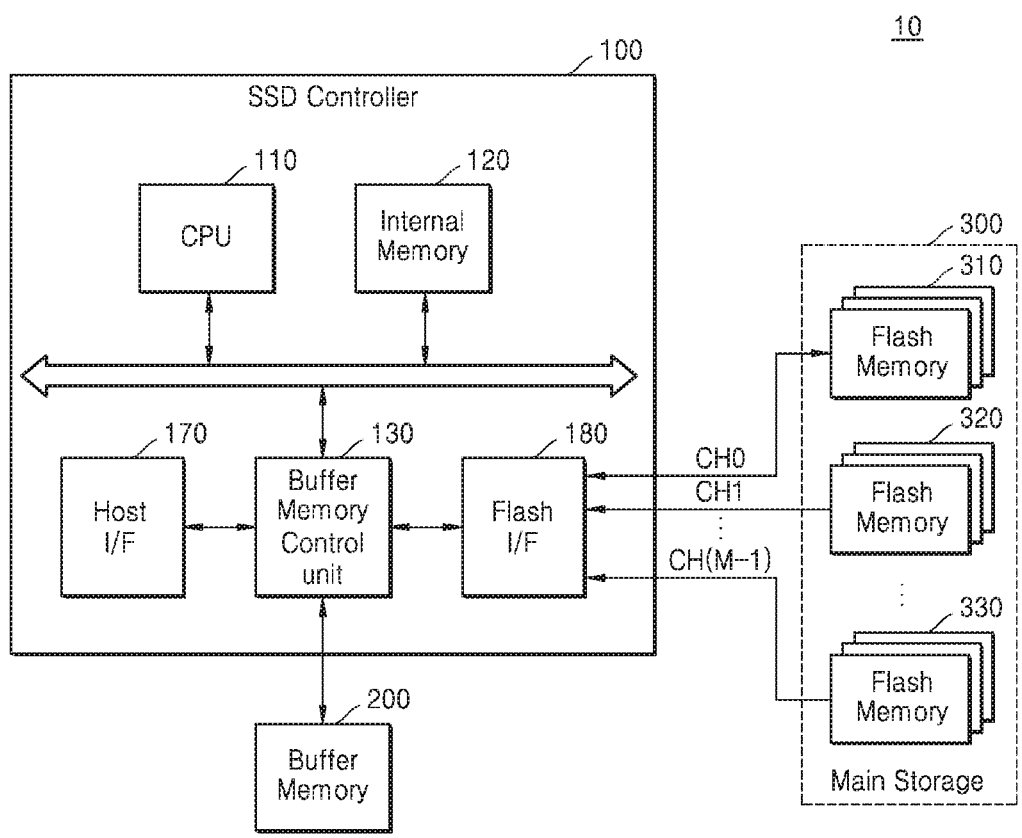
FIG. 2 is a block diagram exemplarily illustrating a detailed configuration of a controller in the data storage device shown in FIG. 1, according to an embodiment of the inventive concept.

FIG. 2 is a block diagram illustrating a detailed configuration of controller 100 in data storage device 10 shown in FIG. 1, according to an embodiment of the inventive concept.

Referring to FIG. 2, controller 100 may include a central processing unit (CPU) 110, an internal memory 120, a buffer memory control unit 130, a host interface 170, and a flash interface 180. CPU 110, internal memory 120, buffer memory control unit 130, host interface 170, and flash interface 180 may be electrically connected to each other via a CPU bus.

CPU 110 may control various operations of controller 100. In controller 100, one or more CPUs 110 may be provided. A case where one CPU or core is provided is referred to as a single core processor, and a case where a plurality of CPUs or cores are provided is referred to as a multi-core processor. CPU 110, internal memory 120, and buffer memory control unit 130 may form a control circuit. The control circuit formed of CPU 110, internal memory 120, and buffer memory control unit 130 may be configured as a single chip based on system on chip (SoC) technology.

The control circuit formed of CPU 110, internal memory 120, and buffer memory control unit 130 may be driven by firmware installed in controller 100. Additional information (e.g., mapping information and the like) processed by the firmware may be stored in a data area of internal memory 120 or may be stored in data storage unit 300. Internal memory 120 may be provided inside CPU 110 or may be provided outside CPU 110.

Host interface 170 may exchange commands, addresses, and data with host 20 in FIG. 1 under the control of CPU 110. Host interface 170 may support one of various interface protocols, such as a Universal Serial Bus (USB) interface, a MultiMediaCard (MMC) interface, a PCI Express (PCI-E) interface, a Serial Advanced Technology Attachment (SATA) interface, a Parallel Advanced Technology Attachment (PATA) interface, a Small Computer System Interface (SCSI), a Serial Attached SCSI (SAS), an Enhanced Small Disk Interface (ESDI), and an Integrated Drive Electronics (IDE) interface. Buffer memory control unit 130 may control write, read, and erase operations of internal memory 120 and buffer memory 200 in response to the control of CPU 110.

Flash interface 180 may perform data transmission and reception between internal memory 120 and/or buffer memory 200 and data storage unit 300.

When a read command is input from host 20, read data read from data storage unit 300 may be temporarily stored in buffer memory 200 through flash interface 180 and buffer memory control unit 130. The read data temporarily stored in buffer memory 200 may be output to the outside (or host 20) through buffer memory control unit 130 and host interface 170.

A write command input from host 20 may be performed in two steps, i.e., first and second steps. In the first step, write data input through host interface 170 is temporarily stored in buffer memory 200 through buffer memory control unit 130. In the second step, the write data temporarily stored in buffer memory 200 is programmed into data storage unit 300 through buffer memory control unit 130 and flash interface 180. The first step may be referred to as a buffer memory write operation, and the second step may be referred to as a NAND program job (NPJ) or a flash program operation. The NPJ may be performed in parallel through a plurality of channels (e.g., M channels) provided in data storage unit 300.

A function of temporarily storing read/write data may be performed using a data area of internal memory 120 in addition to buffer memory 200. As the size of the read/write data increases, the function of temporarily storing the read/write data may be performed mainly in buffer memory 200, rather than in internal memory 120.

In an exemplary embodiment, while executing the write command, CPU 110 may provide a signal indicating the end of a write command to host 20 via host interface 170 when simply a buffer memory write operation is completed. An NPJ that has not yet been processed may be internally performed in data storage device 10 at an appropriate time when CPU 110 is not busy.

A plurality of channels (e.g., M channels) CH0, CH1, . . . , CH(M−1) may be formed between controller 100 and data storage unit 300. A plurality of memory packages 310, 320, . . . , 330 may be electrically connected to the plurality of channels CH0, CH1, . . . , CH(M−1), respectively. Each of memory packages 310, 320, . . . , 330 may include a plurality of semiconductor dies. The plurality of semiconductor dies may be stacked and be electrically interconnected via bonding wires, solder bumps, and/or through silicon vias (TSVs).

The channels CH0, CH1, . . . , CH(M−1) may denote buses capable of sending and receiving commands and data to memory packages 310, 320, . . . , 330, respectively. Memory packages 310, 320, . . . , 330 connected to the different channels CH0, CH1, . . . , CH(M−1) may each operate independently. Memory packages 310, 320, . . . , 330 connected to the channels CH0, CH1, . . . , CH(M−1), respectively, may each configure a plurality of ways Way0, Way1, . . . , Way(N−1). N or more semiconductor dies may be connected to N ways configured in each channel. For example, (N+1) to 16N semiconductor dies may be provided for N ways configured in each channel.

For example, memory package 310 may configure N ways Way0, Way1, . . . , Way(N−1) in the channel CH0. More semiconductor dies than N ways may be connected to the channel CH0. The correspondence between the channel and the memory package may be equally applied to other channels CH1, . . . , CH(M−1).

Figure 3A:
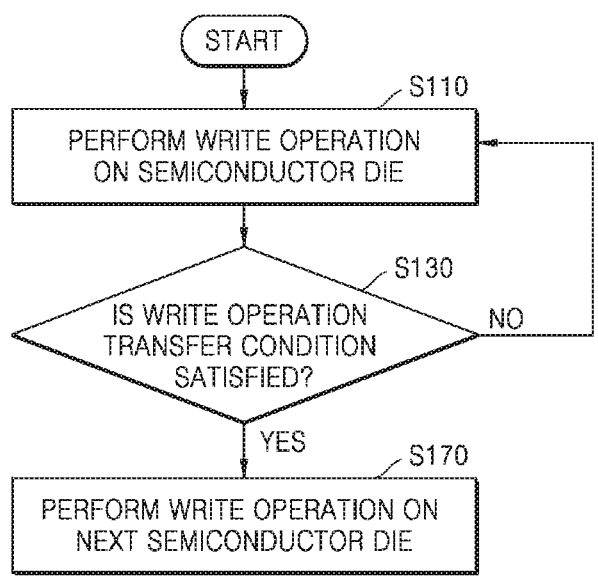
FIGS. 3A and 3B are flowcharts illustrating a method of operating a data storage device, according to embodiments of the inventive concept.
Figure 3B:
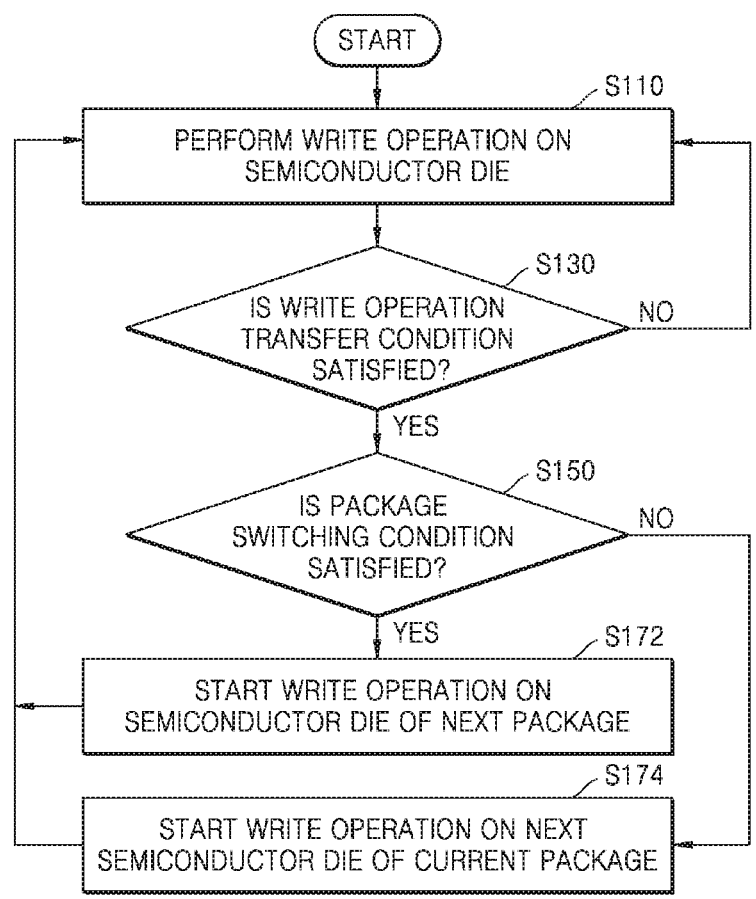
Figure 4A:
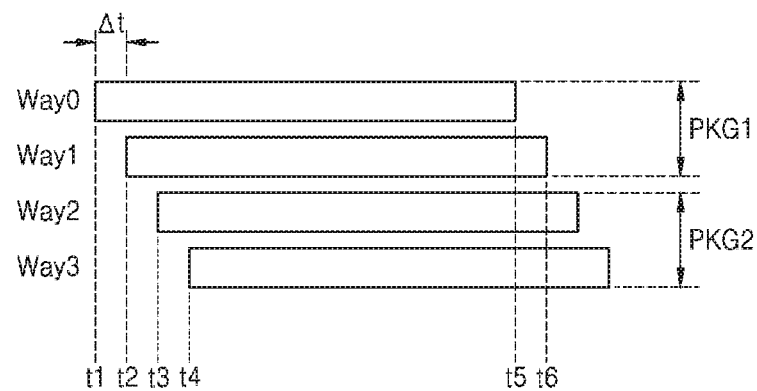
FIGS. 4A and 5A are timing diagrams illustrating a scheme in which a write operation is performed on semiconductor dies via each way through an arbitrary channel of a data storage unit.
Figure 4B:
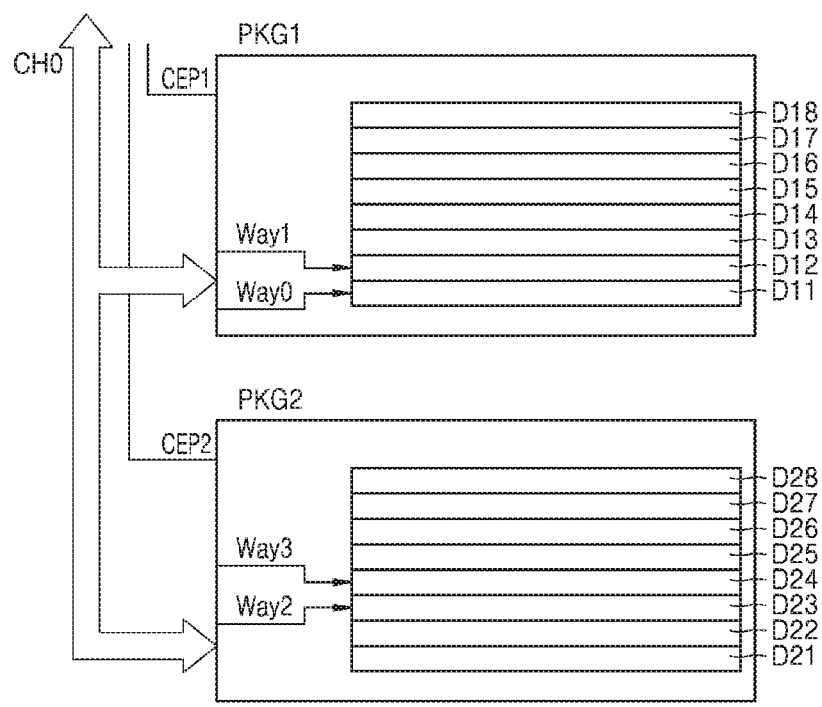
FIGS. 4B and 5B are conceptual diagrams showing the operation of the scheme.
Figure 4C:
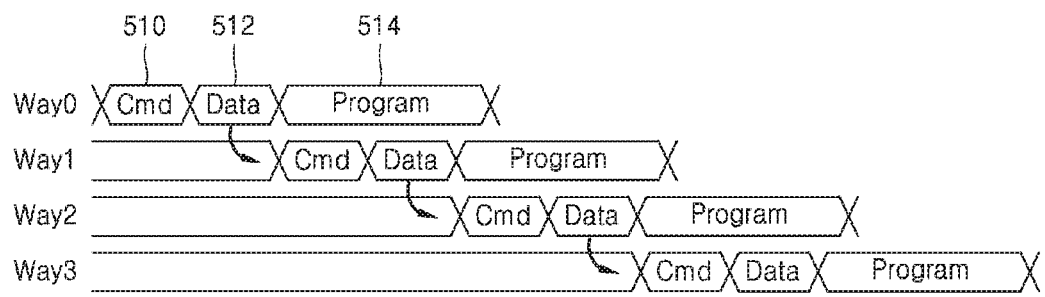
FIG. 4C is a timing diagram more specifically showing each component of the timing diagram of FIG. 4A.
Figure 5A:
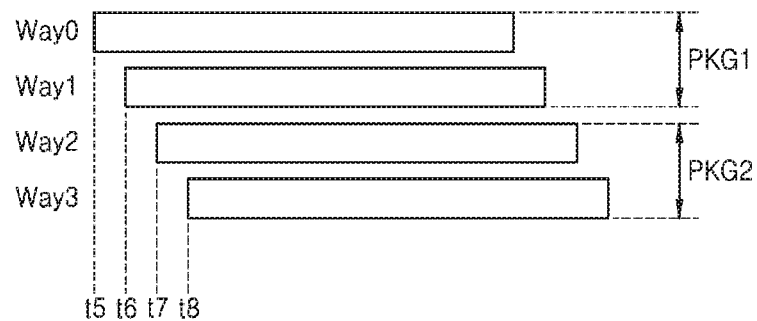
Figure 5B:
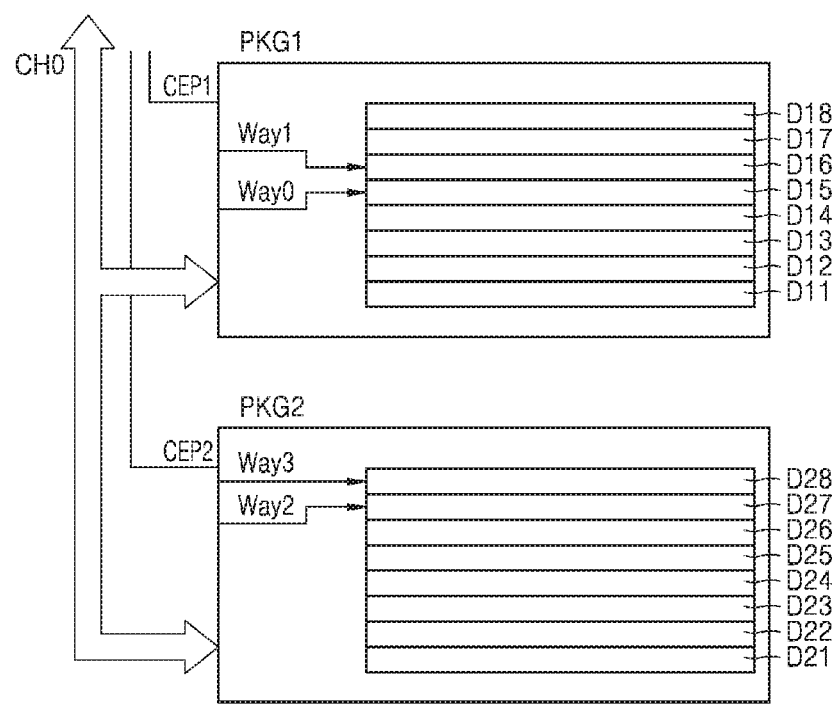

FIGS. 3A and 3B are flowcharts illustrating a method of operating a data storage device, according to embodiments of the inventive concept. FIGS. 4A and 5A are timing diagrams illustrating a scheme in which a write operation is performed on semiconductor dies via each way through an arbitrary channel of data storage unit 300 of FIG. 2. FIGS. 4B and 5B are conceptual diagrams showing the operation of the scheme. FIG. 4C is a timing diagram more specifically showing each component of the timing diagram of FIG. 4A.

Referring to FIGS. 3A, 4A, and 4B, two packages, that is, a first memory package PKG1 and a second memory package PKG2, may correspond to the channel CH0. Eight semiconductor dies may be included in each of the first memory package PKG1 and the second memory package PKG2. It will be understood by one of ordinary skill in the art that less or more than eight semiconductor dies may be included in each of the first memory package PKG1 and the second memory package PKG2. The channel CH0 may be electrically connected to the first memory package PKG1 and the second memory package PKG2, and whether to use the first memory package PKG1 and the second memory package PKG2 may be determined by a first chip enable pin CEP1 and a second chip enable pin CEP2, respectively. In some embodiments, one memory package may include a plurality of chip enable pins. The number of ways corresponding to one chip enable pin CEP1 or CEP2 may be less than the number of semiconductor dies corresponding to the one enable pin CEP1 or CEP2. The number of chip enable pins corresponding to one channel may be less than the number of ways in the one channel.

Each component of the timing diagram shown in FIG. 4A is more specifically shown in FIG. 4C. Referring to FIG. 4C, operations such as "command" 510, "data" 512, and "program" 514 may be performed in order for data to be written in a semiconductor die. A part indicated by program 514 may be a period during which data is actually written to the semiconductor die.

In controller 100, data and commands may exist for each of the channels CH0, CH1, . . . , CH(M−1). Thus, write operations for the channels CH0, CH1, . . . , CH(M−1) may be completely overlapped and performed in parallel. Therefore, only the channel CH0 will be described here, and description of other channels will be omitted.

In the $0^{th}$ to $3^{rd}$ ways Way0, Way1, Way2, and Way3 of the channel CH0, the operations, such as command 510, data 512, and program 514, may not completely overlap. That is, the operations of command 510 and data 512 may be performed only in one way at a time in the order of the ways. Meanwhile, the operation of program 514 may be performed in parallel in the $0^{th}$ to $3^{rd}$ ways Way0, Way1, Way2, and Way3, and the program operation 514 performed in one way may also be performed in parallel with a command operation 510 and a data operation 512 of another way.

Command 510 and data 512 may be transferred through the $0^{th}$ way Way0, and then the operation of program 514 may be performed. When a write operation transfer condition described later is satisfied, command 510 and data 512 may be transferred through the $1^{st}$ way Way1, and then the operation of program 514 may be performed. A write operation may be performed through the $2^{nd}$ way Way 2 and the $3^{rd}$ way Way 3 in the same manner.

As shown in FIG. 4C, the write operation transfer condition is whether or not command 510 and data 512 have been transferred through a corresponding way. That is, when command 510 and data 512 have been transferred through a corresponding way, then a next write operation may be performed through the next way.

As described above, the operation of program 514 may be performed in parallel and thus the transfer of command 510 and data 512 via the next way may be allowed even if the operation of program 514 in the previous way is not terminated.

For example, Δt (see FIG. 4A), which is a specified time interval between a write operation through the $0^{th}$ way Way0) and a next write operation through $1^{st}$ way Way1, may correspond to a transfer time of command 510 and data 512 through the $0^{th}$ way Way0) in FIG. 4C. However, the inventive concept is not limited thereto.

Referring back to FIG. 4A, semiconductor dies D11, D12, . . . , D18, D21, D22, . . . , D28 belonging to the $0^{th}$ channel CH0 may be configured so that a next write operation is sequentially transferred to another semiconductor die in the same channel when a write operation transfer condition is satisfied. For example, at time t1, a first write operation is performed on the semiconductor die D11 of the first memory package PKG1 through the $0^{th}$ way Way0) (Operation S110). Then, it is determined whether or not a write operation transfer condition is satisfied (Operation S130). When the write operation transfer condition is satisfied at time t2, a next write operation may be performed on the semiconductor die D12 of the first memory package PKG1 through the $1^{st}$ way Way1 (Operation S170). Here, the write operation transfer condition may be that a time interval of writing data to the semiconductor die D11 of the first memory package PKG1 corresponds to the specified time interval Δt or the size of data to the semiconductor die D11 of the first memory package PKG1 written between times t1 and t2 corresponds to a threshold amount of data.

A write operation may be transferred such that a next write operation on the next semiconductor die is performed after a previous write operation on the previous semiconductor die is stopped or terminated, or may be transferred such that the next write operation on the next semiconductor die is started while the previous write operation on the previous semiconductor die continues.

Likewise, as write operation transfer conditions are successively satisfied, write operations may be sequentially transferred to the semiconductor die D23 and the semiconductor die D24 of the second memory package PKG2 through the $2^{nd}$ way Way2 and the $3^{rd}$ way Way3, respectively.

As shown in FIG. 4B, when a write operation switching condition is satisfied after a write operation is performed through the $1^{st}$ way Way1, a next write operation may be performed on a semiconductor die in another package. This may be in accordance with the satisfaction of a package switching condition.

That is, the transfer of a write operation may be sequentially performed on other semiconductor dies in the same memory package until the package switching condition is satisfied, and when the package switching condition is satisfied, then a next write operation may be transferred to a semiconductor die in another memory package.

FIG. 3B is a flowchart illustrating a method of operating a data storage device according to this embodiment.

Referring to FIGS. 3B, 4A, and 4B, it is determined whether a write operation transfer condition is satisfied after a write operation is performed on the semiconductor die D11 through the $0^{th}$ way Way 0 (Operation S130). If it is determined that the write operation transfer condition is not satisfied, the write operation on the semiconductor die D11 is continued. On the other hand, if it is determined that the write operation transfer condition is satisfied, it is determined whether a package switching condition is satisfied (Operation S150). Here, the package switching condition is whether or not the number of semiconductor dies to which write operations have been successively transferred in a memory package is greater than or equal to a package switching reference value (e.g., where the package switching reference value is 2).

It may be understood by one of ordinary skill in the art that the package switching condition may be variously set as needed. For example, in some embodiments, when the number of memory packages corresponding to one channel is P (where P is 2), the package switching reference value may be defined as (N/P). In this case, since the number N of ways is 4 and the number P of memory packages is 2, the package switching reference value may be selected as 2. When the value of (N/P) is not an integer, another integer value closest to (N/P) may be selected as the package switching reference value. For example, the package switching reference value may be a selected integer from 1 to 8. The number P of memory packages may be any third integer from 2 to 64.

Since the number of semiconductor dies to which write operations are successively transferred in the first memory package PKG1 is still 1, the package switching condition is not satisfied. Accordingly, a next write operation may be started on the next semiconductor die (e.g., the semiconductor die D12) in the current package (i.e., the first memory package PKG1) via the $1^{st}$ way Way1 to perform the next write operation on the next semiconductor die (Operation S174).

Subsequently, when the write operation transfer condition is satisfied again (Operation S130), it is again determined whether or not the package switching condition is satisfied (Operation S150). In this case, since the number of semiconductor dies to which write operations are successively transferred in the first memory package PKG1 is 2, the package switching condition is satisfied.

Accordingly, a next write operation may be transferred to the semiconductor die D23 of the next package (i.e., the second memory package PKG2) through the $2^{nd}$ way Way2 (Operation S172). Although FIG. 4B shows an example in which the next write operation is transferred to the semiconductor die D23, the next write operation may be transferred to any semiconductor die in the second memory package PKG2.

When the write operation transfer condition is satisfied while the write operation is performed on the semiconductor die D23 (Operation 130), the next write operation may be transferred to the next semiconductor die, that is, the semiconductor die D24 through the $3^{rd}$ way Way3.

In this case, since the number of the semiconductor dies to which write operations are successively transferred in the second memory package PKG2 is equal to or greater than the package switching reference value (where the package switching reference value is 2), the package switching condition is satisfied. When the write operation transfer condition is satisfied while a write operation is performed on the semiconductor die D24, the package switching condition is also satisfied, and therefore, a next write operation through the $0^{th}$ way Way0) is transferred to a semiconductor die in the first memory package PKG1 again. This will be described in detail with reference to FIGS. 3B, 5A and 5B.

Although an example in which a time interval between times t5 and t4 is greater than Δt is shown in FIG. 4A, the time interval between the times t5 and t4 may be less than Δt. Furthermore, although the time t5 is shown to be after the time t4, the time t5 may be earlier than the time t4 or earlier than the time t3.

Referring to FIGS. 3B, 5A and 5B, when a write operation on the semiconductor die D11 through the $0^{th}$ way Way 0 ends at the time t5 (see FIG. 4A) and a write operation transfer condition for a next write operation of the semiconductor die D24 is satisfied (see FIG. 3B), the next write operation may be transferred to the semiconductor die D15. In addition, when a write operation on the semiconductor die D12 through the $1^{st}$ way Way 1 ends at time t6 and a write operation transfer condition for a next write operation of the semiconductor die D15 is satisfied, the next write operation may be transferred to the semiconductor die D16.

In FIG. 5B, write operations are sequentially transferred to the semiconductor die D15 and the semiconductor die D16. Various methods may be used to determine to which semiconductor die in the first memory package PKG1 write operations are transferred. In some embodiments, a semiconductor die (e.g., the semiconductor die D15) next to a semiconductor die (e.g., the semiconductor die D12) used in the most recent previous write operation for the first memory package PKG1 may be preferentially used. Here, "next" may denote a physically adjacent location, and may denote the next in a certain order for the entire set of semiconductor dies in a memory package. Accordingly, a next write operation may be transferred to the semiconductor die D13 or the semiconductor die D17 instead of being transferred to the semiconductor die D15.

Furthermore, a semiconductor die to which a next write operation is transferred when a write operation transfer condition is satisfied while the write operation is performed on the semiconductor die D15 may be the semiconductor die D16, or may also be any one of the semiconductor dies (e.g., the semiconductor dies D13, D14, and D16 to D18) other than semiconductor dies (e.g., the semiconductor dies D11 and D12) used for the most recent previous write operations on the first memory package PKG1. In other words, one (or more) of semiconductor dies that have not been used in the most recent previous write operations on the first memory package PKG1 may be preferentially used for transfer of a next write operation following the write operation on the semiconductor die D15.

As described above, when a write operation is performed on the semiconductor die D15 and the semiconductor die D16 and a write operation transfer condition is satisfied, the transfer of a next write operation between packages is performed in a manner similar to that described with reference to FIGS. 4A and 4B. As a result, the next write operation may be transferred to a semiconductor die of the second memory package PKG2. A semiconductor die (e.g., the semiconductor die D27) next to a semiconductor die (e.g., the semiconductor die D24) used for the most recent previous write operation on the second memory package PKG2 may be preferentially used. In addition, a semiconductor die to which a next write operation is transferred when a write operation transfer condition is satisfied while a previous write operation is performed on the semiconductor die D27 may be the semiconductor die D28.

Figure 6:
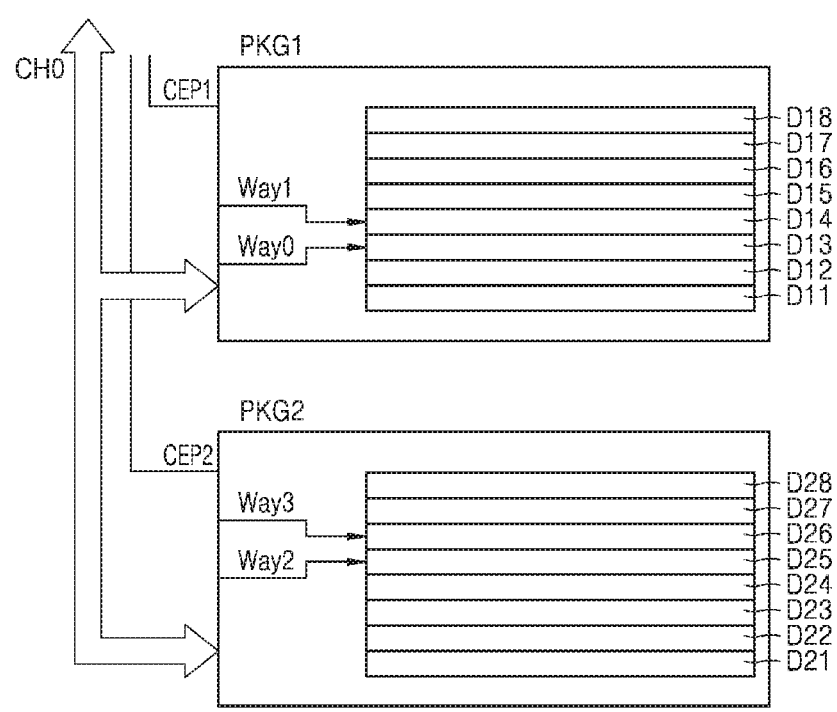
FIGS. 6 and 7 are conceptual diagrams for additionally illustrating an operating method that may be performed subsequent to the method of operating a data storage device, described with reference to FIGS. 3B, 4A, 4B, 5A, and 5B.
Figure 7:
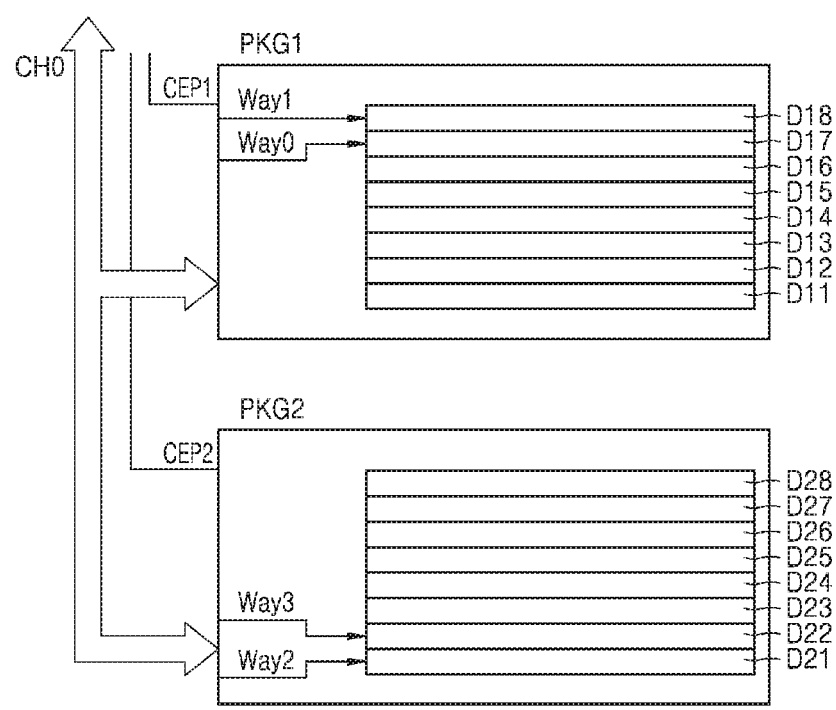

FIGS. 6 and 7 are conceptual diagrams for additionally illustrating an operating method that may be performed subsequent to the method of operating a data storage device which has been described with reference to FIGS. 3B, 4A, 4B, 5A, and 5B.

Referring to FIG. 6, after the write operation of FIG. 5B, write operations may be sequentially performed on the semiconductor die D13 through the $0^{th}$ way Way0) and on the semiconductor die D14 through the $1^{st}$ way Way 1. In addition, when a package switching condition is satisfied, write operations may be sequentially performed on the semiconductor die D25 through the $2^{nd}$ way Way2 and on the semiconductor die D26 through the $3^{rd}$ way Way3.

Similarly, referring to FIG. 7, after the write operation of FIG. 6, write operations may be sequentially performed on the semiconductor die D17 through the $0^{th}$ way Way0 and on the semiconductor die D18 through the $1^{st}$ way Way1. In addition, when a package switching condition is satisfied, write operations may be sequentially performed on the semiconductor die D21 through the $2^{nd}$ way Way2 and on the semiconductor die D22 through the $3^{rd}$ way Way3.

As can be understood from FIGS. 4B, 5B, 6, and 7, write operations through the $0^{th}$ way Way0 and the $1^{st}$ way Way 1 in the first memory package PKG1 may be performed in the order of the semiconductor dies D11, D12, D15, D16, D13, D14, D17, and D18. Similarly, write operations through the $2^{nd}$ way Way2 and the $3^{rd}$ way Way3 in the second memory package PKG2 may be performed in the order of the semiconductor dies D23, D24, D27, D28, D25, D26, D21, and D22. It will be understood by one of ordinary skill in the art that the order of performing the write operations described above may be changed.

In other words, since write operations are sequentially performed on the semiconductor dies D11, D12, . . . , and D18 in the first memory package PKG1, there may be no other semiconductor die in which a write operation is performed more than twice as compared to any one of the semiconductor dies D11, D12, . . . , and D18 in the first memory package PKG1. This is also true for the second memory package PKG2 and there may be no other semiconductor die in which a write operation is performed more than twice as compared to any one of the semiconductor dies D21, D22, . . . , and D28.

Although the above description has been made for the $0^{th}$ channel CH0, the above description of the $0^{th}$ channel CH0 may be similarly applied to the $1^{st}$ channel CH1 to $(M-1)^{th}$ channel CH(M−1).

Figure 8:
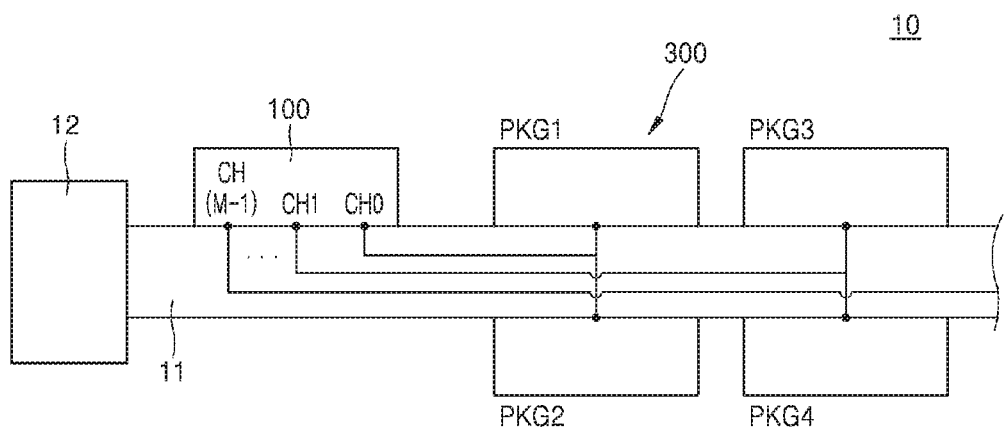
FIG. 8 is a conceptual diagram illustrating an example of implementing a data storage device according to an embodiment of the inventive concept.

FIG. 8 is a conceptual diagram illustrating an example of implementing a data storage device 10 according to an embodiment of the inventive concept.

Referring to FIG. 8, a controller 100 and a data storage unit 300 may be mounted on a substrate 11. Substrate 11 may be, for example, a printed circuit board (PCB) or a flexible PCB substrate.

A terminal 12, which may be connected to a host, may be provided on one side of the substrate 11. Terminal 12 may be configured to be connected in a manner conforming to an SATA standard, a PATA standard, or an SCSI standard. The SATA standard covers all STAT-related standards such as SATA-2, SATA-3, and external SATA (e-SATA) as well as SATA-1. The PATA standard covers all IDE-related standards such as integrated drive electronics (IDE) and enhanced-IDE (E-IDE).

Controller 100 may be electrically connected to memory packages through channels CH0, CH1, . . . , and CH(M−1). Although buffer memory 200 shown in FIG. 1 is not shown in FIG. 8, buffer memory 200 may be mounted on substrate 11 with a connection relationship as shown in FIGS. 1 and 2.

A first memory package PKG1 and a second memory package PKG2, connected to the channel CH0, may be mounted on the upper surface and the lower surface of substrate 11, respectively. A third memory package PKG3 and a fourth memory package PKG4, connected to the channel CH1, may be mounted on the upper surface and the lower surface of substrate 11, respectively.

When write operations are concentrated on any one memory package connected to one channel (e.g., the channel CH0), heat generation is concentrated on the memory package and thus sufficient performance may not be obtained.

However, as described with reference to FIGS. 3A to 7, since write operations are performed by being distributed substantially equally to the first memory package PKG1 and the second memory package PKG2, heat generated in the first memory package PKG1 and heat generated in the second memory package PKG2 may be distributed very uniformly. In other words, controller 100 may allow all packages belonging to one channel to always use the same number of semiconductor dies according to the control method described above, so that heat generated in the packages is evenly distributed to each package in the channel. Therefore, when a data storage device according to an embodiment of the inventive concept is used, sufficient performance may be obtained with relatively low heat generation.

In embodiments described above, M, which is the number of channels, may be a first integer of 1 to 16, and N, which is the number of ways of each channel, may be a second integer of 2 to 128. The number of semiconductor dies present in the data storage device 10 may be greater than M×N and less than 4096.

Although, in FIG. 8, the first memory package PKG1 and the third memory package PKG3 are shown as separate packages separated from each other, the first memory package PKG1 and the third memory package PKG3 may be arranged adjacent to each other side-by-side and be provided integrally in a single encapsulating resin. Likewise, the second memory package PKG2 and the fourth memory package PKG4 may be arranged adjacent to each other side-by-side and be provided integrally in a single encapsulating resin. Also, the first memory package PKG1 and the third memory package PKG3 may be combined into a single package, and the second memory package PKG2 and the fourth memory package PKG4 may be combined into a single package.

Figure 9:
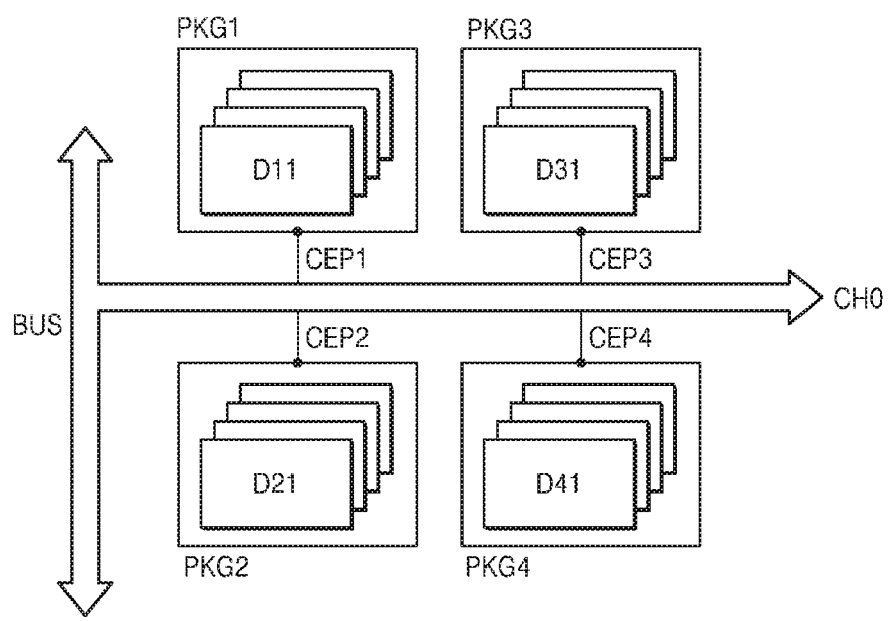
FIG. 9 is a block diagram illustrating an example in which three or more memory packages are connected to one channel.

FIG. 9 is a block diagram illustrating an example in which three or more memory packages, e.g., first to fourth memory packages PKG1, PKG2, PKG3, and PKG4, are connected to one channel CH0. FIGS. 4B, 5B, 6 and 7 show an example in which two memory packages PKG1 and PKG2 are connected to one channel CH0.

Referring to FIG. 9, each of the first to fourth memory packages PKG1, PKG2, PKG3, and PKG4 may include a plurality of semiconductor dies D11, D21, D31, and D41 and may be configured to transmit and receive data through the channel CH0. Whether the first memory package PKG1, the second memory package PKG2, the third memory package PKG3, and the fourth memory package PKG4 will transmit or receive data may be determined through a first chip enable pin CEP1, a second chip enable pin CEP2, a third chip enable pin CEP3, and a fourth chip enable pin CEP4, respectively.

The channel CH0 may have N ways, and N, which is the number of ways, may be greater than the number of chip enable pins (where the number of chip enable pins is 4). When the number of memory packages corresponding to the channel CH0 is P (where P is 4), a package switching reference value may be (N/4). When (N/4) is not an integer, the package switching reference value may be another integer closest to (N/4). Then, after write operations are performed through (N/4) semiconductor dies in each of the memory packages PKG1, PKG2, PKG3, and PKG4, the next write operation may be transferred between packages.

Specifically, write operations may be performed on the first memory package PKG1. In this case, after the write operations are sequentially performed on (N/4) semiconductor dies among a plurality of semiconductor dies in the first memory package PKG1, the next write operation may be transferred to the second memory package PKG2. Then, write operations may be sequentially performed on (N/4) semiconductor dies among a plurality of semiconductor dies in the second memory package PKG2. Then, the next write operations may be sequentially transferred to the third memory package PKG3 and the fourth memory package PKG4 in the same manner. That is, the transfer of the write operations between packages may be sequentially performed on all of the memory packages PKG1, PKG2, PKG3, and PKG4 connected to the channel CH0. Therefore, in the process in which the write operations are sequentially transferred to the first to fourth memory packages PKG1, PKG2, PKG3, and PKG4 and then transferred to the first memory package PKG1 again, there may be no missing memory package among the second through fourth memory packages PKG2, PKG3, and PKG4.

As described above, since a write operation is performed by being distributed substantially equally to the first to fourth memory packages PKG1, PKG2, PKG3, and PKG4, heat generated in the memory packages PKG1, PKG2, PKG3, and PKG4 may be distributed evenly to the memory packages PKG1, PKG2, PKG3, and PKG4. Therefore, damage of a semiconductor device due to overheating resulting from concentration of write operations on any one memory package may be mitigated. In addition, when the temperature of a memory package excessively rises, the operation speed thereof is intentionally limited in order to prevent damage to a device including the memory package, and in this case, such performance deterioration may be prevented in advance and thus excellent data storage performance may be maintained.

FIGS. 10A to 10D are conceptual diagrams illustrating a method of operating the data storage device 10, according to an embodiment of the inventive concept. The conceptual diagrams of FIGS. 10A to 10D show the operation of data storage unit 300 of FIG. 2, by focusing on the channel CH0. FIG. 11 is a graph showing a temperature profile of each memory package as a result of the operation.

Figure 10A:
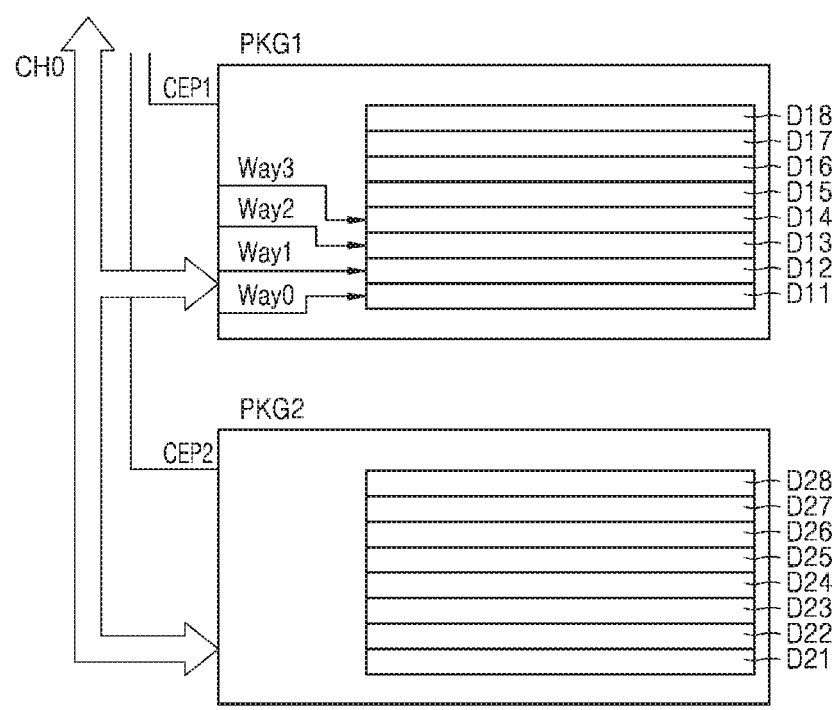
FIGS. 10A to 10D are conceptual diagrams illustrating a method of operating a data storage device, according to an embodiment of the inventive concept.
Figure 11:
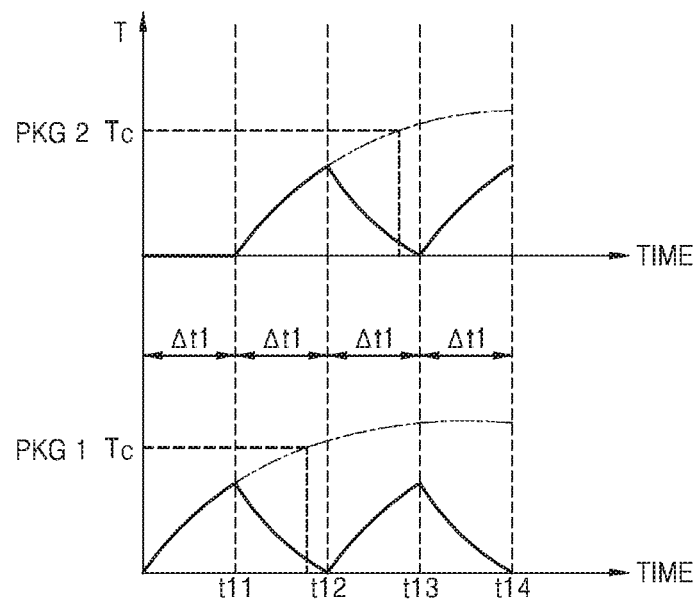
FIG. 11 is a graph showing a temperature profile of each memory package as a result of the operation of a data storage device.

Referring to FIGS. 10A and 11, write operations may be performed on the semiconductor die D11 to the semiconductor die D14 through the $0^{th}$ way Ways) to the $3^{rd}$ way Way3, respectively. In particular, the write operations may be concentrated on the first memory package PKG1 and the write operations may not be performed on the second memory package PKG2. When the write operations are concentrated on the first memory package PKG1 for a predetermined time or more, heat generation in the first memory package PKG1 may be excessive.

More specifically, since the write operations are concentrated on the first memory package PKG1, the temperature of the first memory package PKG1 rises until time t11. Since the write operations are not performed on the second memory package PKG2, the temperature of the second memory package PKG2 does not rise. When the temperature of the first memory package PKG1 rises above a critical temperature Tc, the first memory package PKG1 may be damaged. Also, as one of operations for lowering temperature to prevent damage to the data storage device 10, the overall performance may be deteriorated by intentionally limiting an operation speed.

Figure 10B:
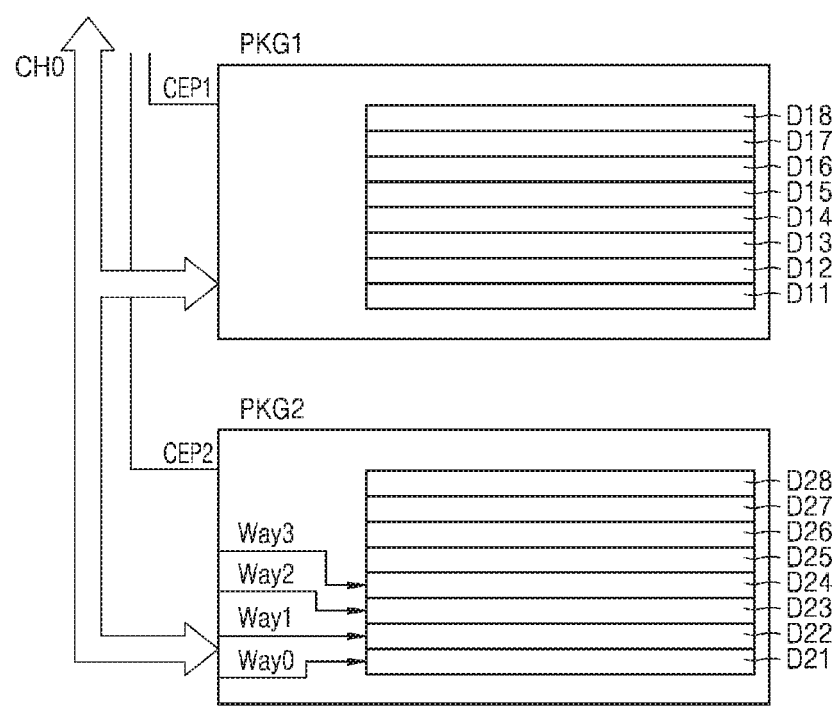

Referring to FIGS. 10B and 11, in order to prevent the excessive heat generation, write operations performed on the first memory package PKG1 may be stopped at time t11 before the temperature of the first memory package PKG1 rises excessively. Then write operations may be performed on the semiconductor die D21 to the semiconductor die D24 of the second memory package PKG2 through the $0^{th}$ way Ways) to the $3^{rd}$ way Way3, respectively.

Then, the temperature of the second memory package PKG2 rises, and the temperature of the first memory package PKG1 is lowered. When the write operations continue for the second memory package PKG2 for a predetermined time or more, heat generation in the second memory package PKG2 may be excessive. If the temperature of the second memory package PKG2 rises above the critical temperature Tc, the second memory package PKG2 may be damaged similar to the problem as described above for the first memory package PKG1.

Figure 10C:
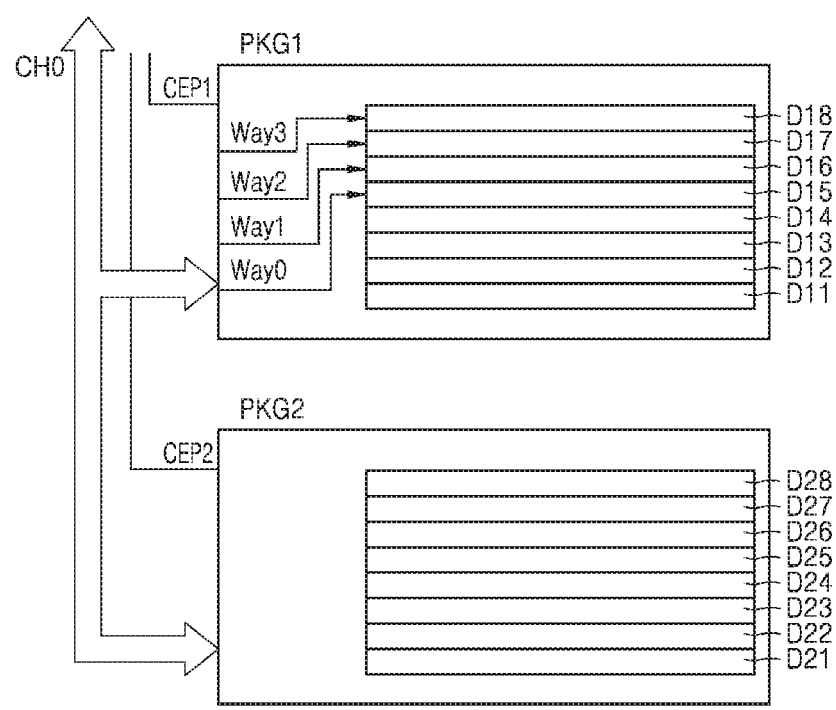

Referring to FIGS. 10C and 11, the write operations on the second memory package PKG2 may be stopped at time t12 to prevent excessive heat generation in the second memory package PKG2. The write operations may be performed on the semiconductor die D15 to the semiconductor die D18 of the first memory package PKG1 through the $0^{th}$ way Ways) to the $3^{rd}$ way Way3, respectively. Likewise, when the write operations are concentrated on the first memory package PKG1 for a predetermined time or more, heat generation in the first memory package PKG1 may be excessive.

Figure 10D:
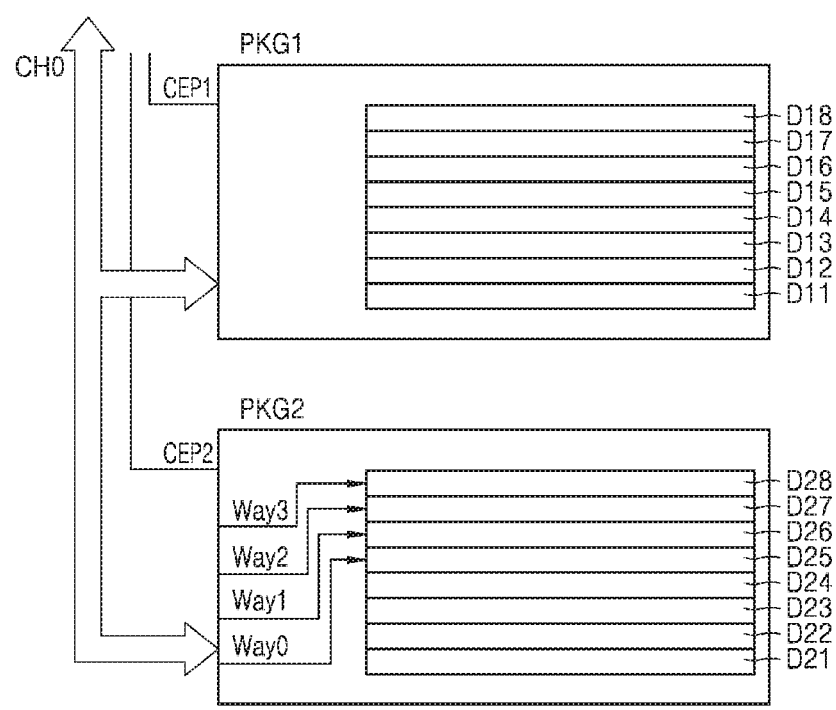

Referring to FIG. 10D and FIG. 11, the write operations on the first memory package PKG1 may be stopped to prevent excessive heat generation in the first memory package PKG1. The write operations may be performed on the semiconductor die D25 to the semiconductor die D28 of the second memory package PKG2 through the $0^{th}$ way Ways) to the $3^{rd}$ way Way3.

As described above, the switching of the write operations to the first memory package PKG1 and the second memory package PKG2 may be performed according to the package switching condition of time. In other words, after the write operations are performed on the first memory package PKG1 for a reference time period Δt1, the write operations on the first memory package PKG1 may be stopped and the next write operation may be performed on the second memory package PKG2. After the reference time period Δt1 has elapsed, the write operations on the second memory package PKG2 may be stopped and the next write operation may be performed on the first memory package PKG1 again.

In other words, the switching of the write operation between the first memory package PKG1 and the second memory package PKG2 may be performed after every reference time period Δt1. The reference time period Δt1 may be, for example, about 0.2 milliseconds (ms) to about 10 seconds. When the reference time period Δt1 is too long, the temperature of a memory package may rise to the critical temperature Tc. On the contrary, when the reference time period Δt1 is too short, the storage of data in data storage unit 300 may be inefficient due to too frequent transfer of the write operation between packages.

Although FIG. 11 shows an example in which the temperatures of the first memory package PKG1 and the second memory package PKG2 rise and fall with time, this temperature change may be exaggerated for clarity.

The reference time period Δt1 may be set to be sufficiently less than the thermal time constant of the first memory package PKG1 and/or the thermal time constant of the second memory package PKG2. The thermal time constant is a unique value according to thermal characteristics of each of the memory packages and may be defined as, in response to a temperature change, a time taken for the memory package to reach a temperature of 63.2% of the temperature change.

When the reference time period Δt1 is set to be sufficiently less than the thermal time constant, for example, from about 0.2 ms to about 10 seconds, from about 0.5 ms to about 3 seconds, or from about 0.7 ms to about 0.5 seconds, it is possible to prevent heat generation from being concentrated on any one of the first and second memory packages PKG1 and PKG2. This is because even if write operation through different ways is concentrated on any one of the first and second memory packages PKG1 and PKG2, the ways are forcibly switched to other memory packages within a short time (e.g., after the reference time period Δt1 has elapsed).

In other words, even if write operations through the $0^{th}$ way Ways) to the $3^{rd}$ way Way3 is concentrated on the first memory package PKG1 (this case corresponds to FIGS. 10A and 10C), the write operation through the $0^{th}$ way Ways) to the $3^{rd}$ way Way3 may be switched to the second memory package PKG2 after the reference time period Δt1 that is sufficiently less than the thermal time constant has elapsed (see FIGS. 10B and 10D). Therefore, a phenomenon in which excessive temperature rise occurs when the write operations are concentrated only on the first memory package PKG1 may be prevented.

It is also possible to keep the temperatures of the first memory package PKG1 and the second memory package PKG2 substantially constant by sufficiently shortening the reference time period Δt1.

In the embodiment described with reference to FIGS. 10A to 10D and FIG. 11, the case where the package switching condition is time is exemplified. In some embodiments, the package switching condition may be a data size.

Figure 12:
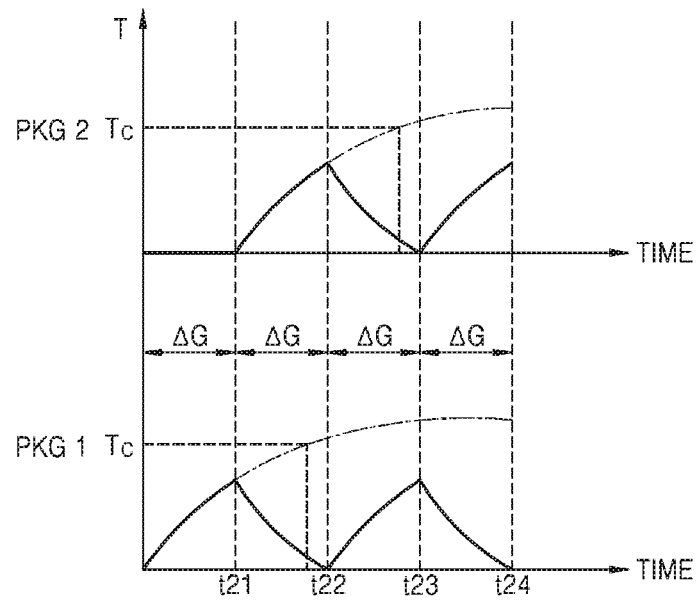
FIG. 12 is a graph showing a temperature profile of each memory package when a package switching condition is a data size.

FIG. 12 is a graph showing a temperature profile of each memory package when the package switching condition is a data size.

Referring to FIGS. 10A and 12, a write operation may be performed on the semiconductor die D11 to the semiconductor die D14 through the $0^{th}$ way Ways) to the $3^{rd}$ way Way3, respectively. The temperature of the first memory package PKG1 rises as described with reference to FIG. 11, and when the write operations are concentrated on the first memory package PKG1 for a predetermined time or more, heat generation in the first memory package PKG1 may be excessive.

In order to prevent such excessive heat generation, when data has been written to the first memory package PKG1 up to a predetermined reference data size (ΔG), writing to the first memory package PKG1 may be stopped at that point t21 and writing to the second memory package PKG2 may be started.

Referring to FIGS. 10B and 12, write operations can be performed on the semiconductor die D21 to the semiconductor die D24 of the second memory package PKG2 through the $0^{th}$ way Ways) to the $3^{rd}$ way Way3, respectively. The temperature of the second memory package PKG2 rises as the write operations progress, as described with reference to FIG. 11, and when the writing of data having a size greater than the reference data size is concentrated on the second memory package PKG2, heat generation in the second memory package PKG2 may be excessive.

In order to prevent this phenomenon, when data has been written to the second memory package PKG2 up to the reference data size (ΔG), writing to the second memory package PKG2 may be stopped at that point t22 and writing to the first memory package PKG1 may be started.

Referring to FIGS. 10C, 10D, and 12, write operations may be performed on the semiconductor die D15 to the semiconductor die D18 of the first memory package PKG1 and the semiconductor die D25 to the semiconductor die D28 of the second memory package PKG2, similar to the case described with reference to FIG. 11. The write operations may be continued until data of the reference data size ΔG is written, and the transfer of the write operation between packages may be performed because a package switching condition is satisfied when data of the reference data size ΔG is written.

The reference data size ΔG that results in the package switching condition may be, for example, about 4 kilobytes (KB) to about 300 megabytes (MB). When the reference data size ΔG is too large, the temperature of a memory package may rise to the critical temperature Tc. On the other hand, when the reference data size ΔG is too small, the storage of data in data storage unit 300 may be inefficient due to too frequent transfer of the write operation between packages.

The data size ΔG may be appropriately set in consideration of the thermal time constant described above and a write speed (Gb/sec). For example, the reference data size ΔG may be a data size that is writable within a time that is sufficiently shorter than the thermal time constant.

When the reference data size ΔG is sufficiently small so that a time taken to write the data size ΔG is sufficiently shorter than the thermal time constant, for example, when the data size ΔG is about 4 KB to about 300 MB, about 4 KB to about 50 MB, or about 8 KB to 10 MB, it is possible to prevent heat generation from being concentrated on any one of the first and second memory packages PKG1 or PKG2. This is because even if write operations through different ways are concentrated on any one of the first and second memory packages PKG1 and PKG2, the ways are forcibly switched to other memory packages after a short time taken to write data having the reference data size ΔG has elapsed.

In other words, even if write operations through the $0^{th}$ way Ways) to the $3^{rd}$ way Way3 are concentrated on the first memory package PKG1 (this case corresponds to FIGS. 10A and 10C), the write operations through the $0^{th}$ way Ways) to the $3^{rd}$ way Way3 may be switched to the second memory package PKG2 after a short time (this time is sufficiently shorter than the thermal time constant) taken to write data having the data size ΔG has elapsed (see FIGS. 10B and 10D). Therefore, a phenomenon in which excessive temperature rise occurs as the write operations are concentrated only on the first memory package PKG1 may be prevented.

It is also possible to keep the temperatures of the first memory package PKG1 and the second memory package PKG2 substantially constant by setting the reference data size ΔG to be sufficiently small.

When the data storage device according to the embodiment of the inventive concept is used, a phenomenon in which heat generation is concentrated locally may be mitigated.

Damage to a semiconductor device may be reduced or prevented since the phenomenon in which heat generation is concentrated locally is mitigated.

In addition, since the frequency of application of the performance limitation due to temperature rise (e.g., reducing an operating speed) is reduced, it is possible to provide better data storage performance.

Figure 13:
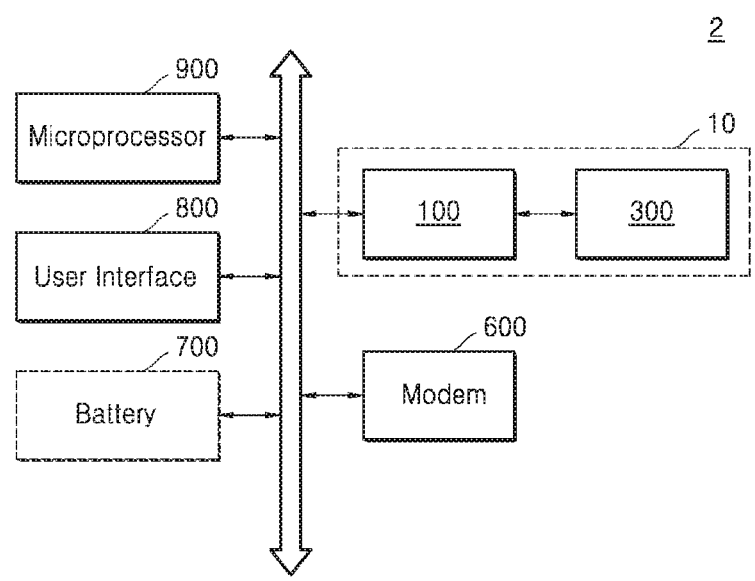
FIG. 13 is a diagram illustrating a configuration of an electronic system according to an embodiment of the inventive concept.

FIG. 13 is a diagram illustrating a configuration of an electronic system 2 according to an embodiment of the inventive concept.

Referring to FIG. 13, the electronic system 2 according to the embodiment of the inventive concept may include a data storage device 10, a modem 600, a user interface 800, and a microprocessor 900, electrically connected to a bus. Modem 600 may include a baseband chipset or a baseband system-on-chip (SoC).

When electronic system 2 is applied to a mobile device, a battery 700 for supplying the operating voltage of electronic system 2 may additionally be provided. Although not shown in FIG. 13, electronic system 2 may be further provided with an application chipset, a camera image processor (CIS), a mobile DRAM, and the like.

Data storage device 10 may include a controller 100 and a data storage unit 300. Data storage device 10 shown in FIG. 13 may be configured with the SSD shown in FIGS. 1, 2, and 8. However, this case is merely an example of configuring data storage device 10, and data storage device 10 may be configured in various forms as well as with an SSD. For example, data storage device 10 may be configured with a memory card and/or a memory card system.

Controller 100 may be electrically connected to the microprocessor 900 and the data storage unit 300. Controller 100 may access the data storage unit 300 in response to a request from microprocessor 900. For example, the controller 100 may control read, write, and erase operations of data storage unit 300. Controller 100 may provide an interface between microprocessor 900 and the data storage unit 300. Controller 100 may drive firmware for controlling data storage unit 300.

Controller 100 may include well known components such as an internal memory, a CPU, a host interface, and a memory interface, as shown in FIG. 2. Controller 100 may also include a buffer memory for temporarily storing data transmitted and received between controller 100 and data storage unit 300 and data transmitted and received between controller 100 and microprocessor 900. The buffer memory may be provided outside controller 100 or may be provided inside controller 100. The buffer memory and the internal memory may be configured with a random access memory such as DRAM or SRAM. The CPU may control all operations of controller 100. The buffer memory and/or the internal memory may be used as an operation memory of the CPU.

The host interface may provide a protocol for performing data exchange between microprocessor 900 (which in some embodiments may be a host) and controller 100. Since this has been described in detail with reference to FIG. 2, an additional description will be omitted.

Data storage unit 300 in data storage device 10 may be used as a main storage device for storing a large amount of data. In some embodiments, i-bit data (i is an integer equal to or greater than 1) to be processed or processed by microprocessor 900 may be stored in data storage unit 300 through SSD controller 100. Data storage unit 300 may include a non-volatile memory that supports a plurality of channels and a plurality of ways. According to an exemplary embodiment, data storage unit 300 may include a flash memory, especially a NAND flash memory, among non-volatile memories.

The flash memory may include a memory cell array for storing data, a read and write circuit for writing and reading data to and from the memory cell array, an address decoder for decoding an address transmitted from the outside and transmitting the decoded address to the read and write circuit, and a control logic for controlling all operations of the flash memory.

In an exemplary embodiment, flash memory cells of the flash memory may be implemented using one of various cell structures having a charge storage layer. A cell structure having the charge storage layer may be formed by using a charge trap flash structure using a charge trap layer, a stack flash structure in which arrays are stacked in multiple layers, a flash structure without a source and a drain, a fin-type flash structure, and a vertical NAND (VNAND) structure in which a channel layer extends in the vertical direction and word lines extend in the horizontal direction. In addition, in an exemplary embodiment, the read and write circuit may include a page buffer circuit having a plurality of page buffers.

Although not shown in FIG. 13, data storage device 10 may additionally include an error correction block. The error correction block may detect and correct errors in data read from data storage unit 300. As an example, the error correction block may be provided as a component of controller 100. As another example, the error correction block may be provided as a component of data storage unit 300.

Controller 100 and data storage unit 300 may be integrated into a single semiconductor device. In an exemplary embodiment, controller 100 and data storage unit 300 may be integrated into a single semiconductor device to form a memory card. For example, controller 100 and data storage unit 300 may be integrated into a single semiconductor device to form a personal computer memory card international association (PCMCIA) card, a compact flash (CF) card, a smart media card (SMC), a memory stick, a multimedia card (MMC, RS-MMC, or MMCmicro), an SD card (SD, miniSD, microSD, or SDHC), or a universal flash memory device (UFS).

As another example, controller 100 and data storage unit 300 may be integrated into a single semiconductor device to form a solid state drive (SSD) as shown in FIGS. 1, 2, and 8.

As another example, data storage device 10 may be applied to a computer, a portable computer, an ultra mobile PC (UMPC), a workstation, a netbook, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving information in a wireless environment, and one of various electronic devices constituting a home network. Data storage device 10 may also be applied to one of various electronic devices constituting a computer network, and may be applied to one of various electronic devices constituting a telematics network. In addition, data storage device 10 may be applied to a radio frequency identification (RFID) device and one of various components (e.g., a semiconductor drive such as SSD, a memory card, etc.) constituting an electronic system.

Data storage unit 300 and/or data storage device 10 may be implemented in various types of packages. For example, data storage unit 300 and/or data storage device 10 may be implemented in a Package on Package (PoP), a Ball Grid Array (BGA), a Chip Scale Package (CSP), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), or the like.

The inventive concept may also be embodied as computer readable codes on a tangible computer readable recording medium. The computer readable recording medium is any data storage device that can store data which can be thereafter read by a computer system. Examples of the computer readable recording medium include read-only memory (ROM), random-access memory (RAM), CD-ROMs, flash memories, USB memories, magnetic tapes, floppy disks, hard disks, optical data storage devices, SSDs, etc. The computer readable recording medium can also be distributed over network coupled computer systems so that the computer readable code is stored and executed in a distributed fashion.

While the inventive concept has been particularly shown and described with reference to embodiments thereof, it will be understood that various changes in form and details may be made therein without departing from the spirit and scope of the following claims.

What is claimed is:

1. A data storage device, comprising:
   a controller mounted on a substrate and configured to check whether a write operation transfer condition is satisfied; and
   a plurality of memory packages comprising M channels, where M is a natural number of 1 to 16, and each of the M channels comprising N ways, where N is a natural number of 2 to 128, and each of the plurality of memory packages including at least one semiconductor die and configured to transmit and receive data to and from the controller-through one of the M channels,
   wherein, when the write operation transfer condition is determined to be satisfied, a first memory package belonging to a first channel among the plurality of memory packages performs a first write operation, and a second memory package belonging to the first channel among the plurality of memory packages performs a second write operation consecutively in response to first and second write commands from the controller respectively, and when the write operation transfer condition is determined to be not satisfied the first memory package performs the first and second write operations in response to the first and second write commands from the controller respectively.

2. The data storage device of claim 1, wherein both the first write operation and the second write operation are sequentially performed on the semiconductor dies belonging to the same channel.

3. The data storage device of claim 1, wherein the first channel comprises at least two memory packages, and wherein transferring of the second write operation to the second memory package is performed immediately after the first write operation.

4. The data storage device of claim 3, wherein the first channel comprises at least three memory packages, and comprises at least two ways, and the first and the second memory packages belong to different ways respectively.

5. The data storage device of claim 1, wherein transferring of the write operation are sequentially performed on other semiconductor dies in the first memory package until a package switching condition is satisfied, and when the package switching condition is satisfied, the transfer of the write operation from the first memory package to the second memory package is performed such that the write operation is transferred to the second memory package and the write operation is performed on a semiconductor die of the second memory package,
   wherein the package switching condition is satisfied when a number of semiconductor dies to which the write operation is successively transferred in the first package is greater than or equal to a package switching reference value which is a selected natural number of 1 to 8, and
   wherein a number of memory packages corresponding to the first channel is P (where P is a third integer of 2 to 64), and wherein the package switching reference value is (N/P) when (N/P) is an integer, and is another integer closest to (N/P) when (N/P) is not the integer.

6. The data storage device of claim 1, wherein transfers of the write operation are sequentially performed on other semiconductor dies in the first memory package until a package switching condition is satisfied, and when the package switching condition is satisfied, the transfer of the write operation from the first memory package to the second memory package is performed such that the write operation is transferred to the second memory package and the write operation is performed on a semiconductor die of the second memory package, and
   wherein transfer of the write operation between packages are sequentially performed on the plurality of memory packages in the first channel.

7. The data storage device of claim 6, wherein a second semiconductor die next to a first semiconductor die last used for a most recent previous write operation in the first memory package is preferentially used for a next write operation when the transfer of the write operation between packages is continued and the next write operation is again transferred to the first memory package.

8. The data storage device of claim 7, wherein, after the second semiconductor die next to the first semiconductor die last used for the write operation has been preferentially used for the write operation, semiconductor dies not used for an immediately previous write operation of the first memory package are preferentially used for the write operation.

9. The data storage device of claim 1, wherein a number of semiconductor dies included in the plurality of memory packages is greater than M×N and less than 4096.

10. The data storage device of claim 9, wherein a number of physical chip enable (CE) pins in one channel is less than N.

11. A data storage device, comprising:
    a controller mounted on a substrate, the controller including a central processing unit (CPU), an internal memory, a buffer memory control unit, and a flash interface; and
    a buffer memory; and
    a plurality of memory packages including M channels, where M is a natural number of 1 to 16, and each of the M channels includes N ways, where N is a natural number of 2 to 128 and each of the plurality of memory packages includes at least one semiconductor die and is configured to transmit and receive data to and from the controller through one of the M channels,
    wherein each of the M channels includes P memory packages (where P is a natural number of 2 to 64), and the controller is configured such that a numbers of ways respectively corresponding to the P memory packages are equal to each other when a write operation of data is performed through one channel, and
    wherein, when a write operation transfer condition is satisfied, a next write operation is transferred to another semiconductor die in a same channel, and when a package switching condition is satisfied, the next write operation is transferred to another memory package in the same channel.

12. The data storage device of claim 11, wherein the memory package for which the write operation is performed is selected using a chip enable pin.

13. The data storage device of claim 11, wherein a number of semiconductor dies included in the plurality of memory packages is greater than M×N.

14. The data storage device of claim 11, wherein a number of physical chip enable (CE) pins in one channel is less than N.

15. A solid state drive (SSD) comprising:
a plurality of memory packages, each of the memory packages having at least one semiconductor die;
a buffer memory; and
a controller including a central processing unit (CPU), an internal memory, a buffer memory control unit, and a flash interface;
wherein the plurality of memory packages being configured to be controlled by the controller and to transmit and receive data to and from the controller via M channels (where M is a natural number of 1 to 16), each of which comprises N ways (where N is a natural number of 2 to 128 and is equal for each of the M channels),
wherein semiconductor dies belonging to one channel are each configured such that a write operation is transferred from one semiconductor die using one way of the N ways to another semiconductor die using another way of the N ways in the one channel when a write operation transfer condition is satisfied,
wherein transfers of the write operation are sequentially performed on the semiconductor dies belonging to the one channel,
wherein the N ways are sequentially used until each of them is used once, and
wherein a number of memory packages is equal for each of the M channels.

16. The SSD of claim 15, wherein semiconductor dies belonging to one channel are each configured such that transfer of the write operation between packages is performed on a semiconductor die of another memory package in the one channel when a package switching condition is satisfied.

17. The SSD of claim 15, wherein the at least one semiconductor die includes at least one of a vertical NAND memory and a DRAM.

18. The SSD of claim 15, wherein the controller is configured to transfer the write operation to another memory package in the same channel when a package switching condition is satisfied.

19. The SSD of claim 15, wherein a number of semiconductor dies included in the plurality of memory packages is greater than M×N and less than 4096.

20. The SSD of claim 19, wherein a number of physical chip enable (CE) pins in one channel is less than N and is equal for each of the M channels.

* * * * *